United States Patent [19]
Goto et al.

[11] Patent Number: 5,351,128
[45] Date of Patent: Sep. 27, 1994

[54] SEMICONDUCTOR DEVICE HAVING REDUCED CONTACT RESISTANCE BETWEEN A CHANNEL OR BASE LAYER AND A CONTACT LAYER

[75] Inventors: Shigeo Goto, Tsukuba; Hidetoshi Matsumoto, Kodaira; Masamitsu Yazawa, Yokohama; Yasunari Umemoto, Tokorozawa; Yoko Uchida, Kawasaki; Kenji Hiruma, Tokorozawa, all of Japan

[73] Assignee: Hitachi, Ltd., Tokyo, Japan

[21] Appl. No.: 919,676

[22] Filed: Jul. 27, 1992

[30] Foreign Application Priority Data

Aug. 2, 1991 [JP] Japan .................. 3-194164

[51] Int. Cl.$^5$ .............. H01L 29/16; H01L 29/205
[52] U.S. Cl. .................. 257/192; 257/189; 257/190; 257/191; 257/194
[58] Field of Search ............ 257/194, 192, 189, 190, 257/191

[56]  References Cited
U.S. PATENT DOCUMENTS

| | | | |
|---|---|---|---|
| 4,608,586 | 8/1986 | Kim | 257/189 |
| 4,980,731 | 12/1990 | Hida | 257/192 |
| 5,124,762 | 6/1992 | Childs et al. | 257/192 |
| 5,144,379 | 9/1992 | Eshita et al. | 257/190 |

FOREIGN PATENT DOCUMENTS 4321239 11/1992 Japan .................. 257/194

OTHER PUBLICATIONS

Selective growth of Pt-GaAs layers for extremely low base-resistance HBTs, Microelectronics Research Laboratories, NEC Corporation, H. Shimawaki, N. Furuhata, K. Honjo, pp. 25-30 no date.

49th Annual Device Research Conference, Jun. 17-19, 1991, Session IIIB-6 "0.2 um Gate AlGaAs HIGFET with a (111) Face of n—GaAs Selectively Grown by MOCVD", Y. Umemoto et al.

Primary Examiner—William L. Sikes
Assistant Examiner—Fetsum Abraham
Attorney, Agent, or Firm—Kenyon & Kenyon

[57] ABSTRACT

A field-effect transistor or a bipolar transistor may be provided in which the contact resistance between a channel layer or base layer and a contact layer are reduced. For example, an InGaAs buffer layer may be formed on the substrate side of an InGaAs channel layer of a field-effect transistor and by the bypassing effect that carriers pass through this InGaAs buffer layer, the InGaAs channel layer comes in contact with the contact layer with a low resistance. The contact resistance between the InGaAs channel layer and the contact layer can be reduced to 10 ohm per a width of 10μm, and as a result, the value of transconductance factor K of a field-effect transistor can be increased in 14 mA/V$^2$ per a width of 10μm.

34 Claims, 6 Drawing Sheets

SOLID LINE REPRESENTS THE CASE WITH p-TYPE InGaAs LAYER AS LAYER 4,
BROKEN LINE REPRESENTS THE CASE WITH GRADED LAYER AS LAYER 4,
DOTTED LINE REPRESENTS THE CASE WITHOUT LAYER 4.

SEMICONDUCTOR DEVICE HAVING REDUCED CONTACT RESISTANCE BETWEEN A CHANNEL OR BASE LAYER AND A CONTACT LAYER

BACKGROUND OF THE INVENTION

The present invention relates to a semiconductor device and method for producing it. More specifically, the present invention relates to field-effect transistors using III-V compound semiconductors and to bipolar transistors.

For example, to produce GaAs/AlGaAs heterojunction field-effect transistors exhibiting a sophisticated performance, it is necessary to reduce the source resistance. In this case, a method for reducing the source resistance by using a heavily doped contact layer formed by selective growth as a contact part between the source electrode and the semiconductor layer has been contemplated.

For example, the following method is mentioned in the specification of Japanese Patent Application No. 2-268361, which is not prior art to the present application.

FIG. 2 is a sectional view of the field-effect transistor of Japanese Patent Application No. 2-268361. An active layer having an n-type GaAs channel layer 105 on a semi-insulating GaAs substrate 1 is subjected to epitaxial growth, and the active layer at the contact part is removed by etching, and then a heavily doped n-type GaAs contact layer 8 is selectively grown at the contact part using a metal oxide chemical vapor deposition (MOCVD) method. According to this method, the source resistance is reduced by a structure that the channel layer 105 is in direct contact with the contact layer 8.

Furthermore, to produce GaAs/AlGaAs heterojunction bipolar transistors exhibiting a sophisticated performance, it is necessary to reduce the base resistance. Also in this case, a method for reducing the base resistance by using a heavily doped contact layer formed by selective growth has been contrived. (For example, the method is described on page 25 of Shingakugiho ED90-136.)

SUMMARY OF THE INVENTION

According to the above described method GaAs is used as a material of the channel layer or the base layer. When InGaAs is used instead of GaAs, the electron saturation velocity can be increased and heavy doping can be established, so that enhancement of the performance can be expected.

However, when InGaAs is used for the channel Layer or base layer, there is a problem imposed that the contact resistance between the channel layer or base layer and the contact layer increases.

The object of the present invention provide a structure of a device of semiconductors having a contact part with a small contact resistance between a conductive layer such as the channel layer or base layer and the contact layer which is different from the conductive layer and a method for producing those semiconductors. The above features of the present invention are accomplished by the structure of a device of semiconductors formed so that the semiconductor layer (hereinafter called a carrier bypass path forming layer) composed of a material having a carrier band level which is continuous to the material of the conductive layer is in contact with the conductive layer and in contact with the contact layer via the conductive layer or directly without the conductive layer. In this case, the fact that the band level comprises a material which is continuous to the material of the conductive layer indicates a semiconductor layer which is equal in electron affinity to the material of the n-type conductive layer or equal in the sum of the electron affinity and the band gap to the material of the p-type conductive layer.

Furthermore, the above features of the present invention are accomplished by the production method of a semiconductor device which comprises the steps of forming a semiconductor layer which is an active part of the device such as a conductive layer and a carrier bypass path forming layer on a substrate, and etching and removing the semiconductor layer in the area for forming a contact layer, and then forming a contact layer by selective growth.

The operation of the present invention will be explained hereunder. FIGS. 3(a) and 3(b) are drawings for explaining the causes for increasing the contact resistance of a field-effect transistor, which are sectional views of the contact part when a GaAs channel layer and an InGaAs channel layer are used.

The first cause for increasing the contact resistance is considered to be an effect that high density interface states are formed at the contact part of an undoped AlGaAs layer 6 and an n-type GaAs contact layer 8 and, therefore, the area near the contact part of a channel layer 105 or 5 and the contact layer 8 is depleted.

The second cause is as follows. The depletion effect exists both in the GaAs channel 105 and InGaAs channel 5. However, in the case of the n-type GaAs channel 105 shown in FIG. 3(a), on the substrate side of the channel layer 105, there is a buffer layer 3 also composed of GaAs, so that carriers easily bypass the substrate side of a depleted area 202 and reach the channel layer 105 via a carrier bypass path 203 formed in the buffer layer 3. Therefore, the resistance at the contact part is low and no problem is imposed. However, when n-type InGaAs is used in the channel layer 5 as shown in FIG. 3(b), the buffer layer 3 on the substrate side of the n-type InGaAs channel layer 5 comprises GaAs, so that the junction between the channel layer 5 and the buffer layer 3 is a heterojunction 204 and the conduction band in the band diagram is discontinuous. As a result, the bypassing of carriers from the substrate side is obstructed at the heterojunction 204 between the InGaAs and GaAs layers and the resistance at the contact part increases (for example, to 1 kohm to 100 kohm). Therefore, the second cause for increasing the contact resistance is that a layer which exists in contact with the channel layer forms a heterojunction (band discontinuity) with the channel layer.

The interface state density generated in this case varies with the material. The interface state density of AlGaAs containing Al among III–V compound semiconductors is high compared with those of other compounds.

Also in the case of a GaAs-AlGaAs heterojunction bipolar transistor, the contact resistance increases by the same causes as those for a field-effect transistor. In this case, the channel layer and the buffer layer of the field-effect transistor may be replaced with the base layer and the collector layer of the bipolar transistor respectively. Furthermore, of the present invention is not always limited to field-effect transistors and bipolar transistors as long as semiconductor devices are used in which above contact defect occurs.

According to the present invention, a carrier bypass path forming layer is formed whose carrier band is continuous to that of the conductive layer, so that carriers in the contact layer flow into the conductive layer via the carrier bypass path forming layer or carriers in the conductive layer reversely flow into the contact layer via the carrier bypass path forming layer. As a result, the obstruction for bypassing of carriers due to band discontinuity of the heterojunction interface can be moderated and the resistance at the contact part can be reduced. FIG. 1 is a sectional view of an example of a field-effect transistor according to the present invention and FIG. 4 is a band diagram of the field-effect transistor shown in FIG. 1. For example, on the substrate side of an InGaAs channel layer 5, an InGaAs layer 4 or a graded layer 4 wherein the InAs mole fraction is changed from InGaAs down to GaAs is inserted (see FIGS. 1 and 4). By doing this, the obstruction for bypassing of carriers due to band discontinuity of the InGaAs-GaAs heterojunction (the junction between the layer 5 and the layer 3) is moderated and the resistance at the contact part is low in the same way as in the case in which GaAs is used for the channel layer.

The carrier bypass path forming layer is formed on the substrate side of the conductive layer in FIGS. 1 and 4. However, an embodiment of the present invention may be implemented in which that the carrier bypass path forming layer is formed on the opposite side of the substrate.

Furthermore, according to an embodiment of the present invention the GaAs layer 3 may not be used and the contact layer may not be in contact with the conductive layer.

Furthermore, although many interface states are formed particularly on an undoped AlGaAs layer 6, interface states are formed also on the InGaAs channel layer 5 and a depletion layer which is formed by them exists. Therefore, the present invention is also effective in a semiconductor device with a structure in which the undoped AlGaAs layer 6 is not formed.

DETAILED DESCRIPTION

The present invention will be explained in more detail according to following the embodiments.

EMBODIMENT 1

Figure 1:
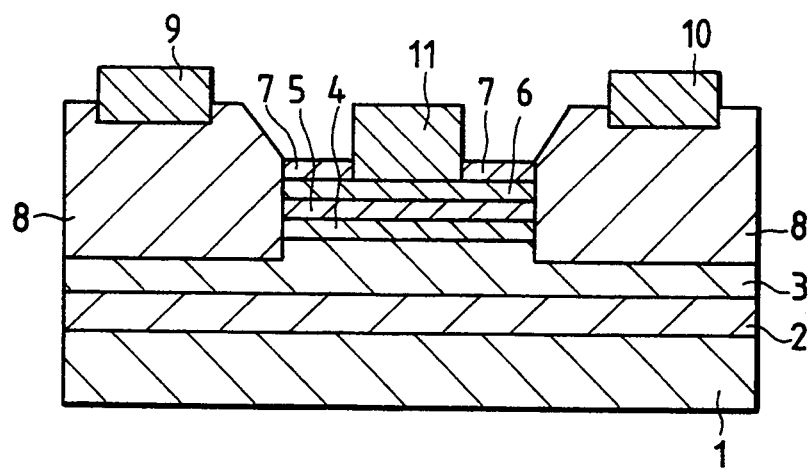
FIG. 1 is a sectional view of the fleeing-effect transistor of Embodiment 1 of the present invention.
Figure 2:
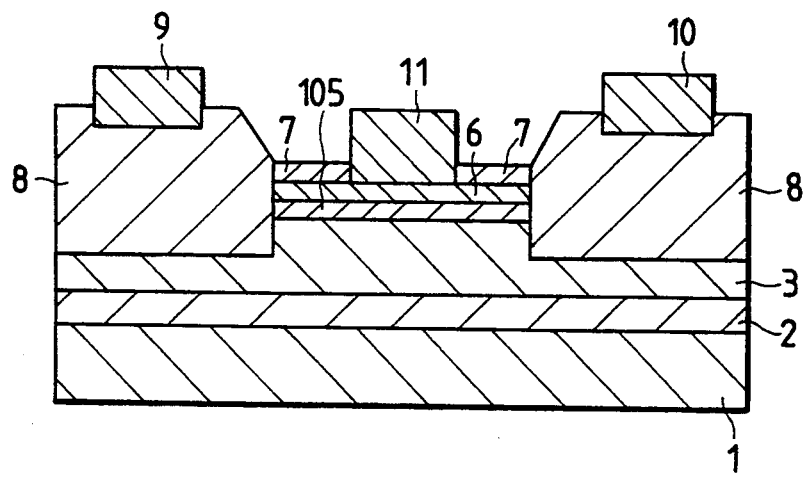
FIG. 2 is a sectional view of an example of field-effect transistors.
Figure 3A:
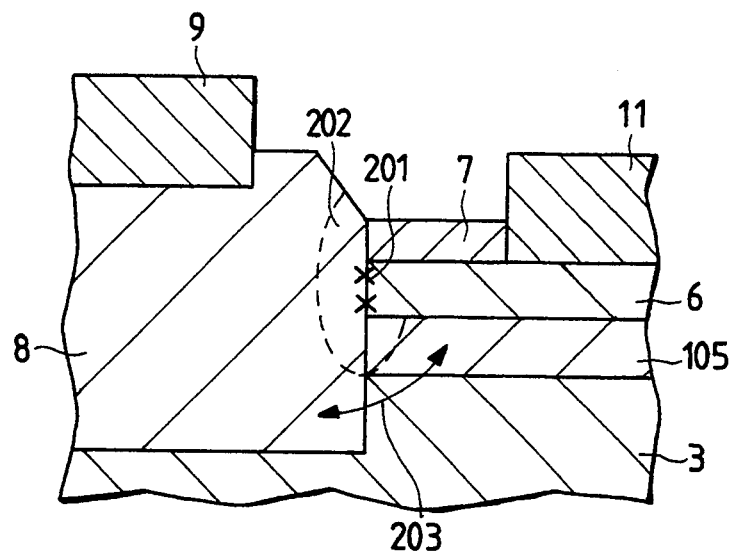
FIG. 3(a) is a drawing for explaining a cause for increasing the contact resistance of a field-effect transistor, which is a sectional view of the contact part when a GaAs channel layer is used.
Figure 3B:
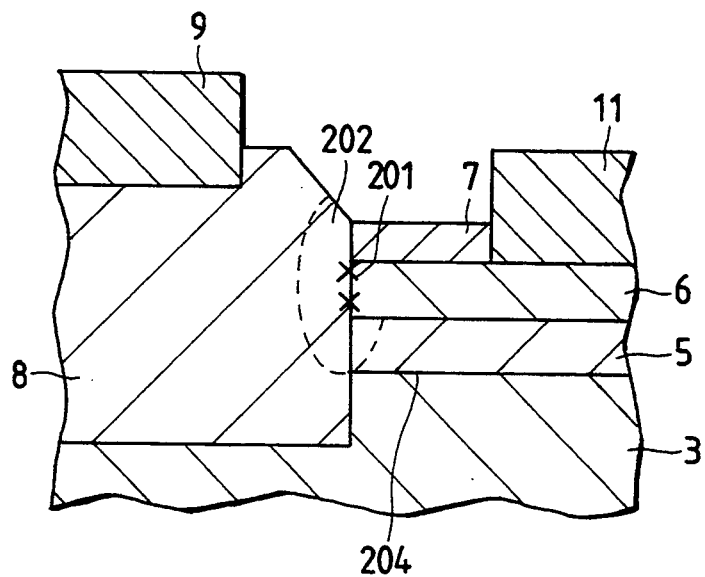
FIG. 3(b) is a drawing for explaining a cause for increasing the contact resistance of a field-effect transistor, which is a sectional view of the contact part when an InGaAs channel layer is used.
Figure 4:
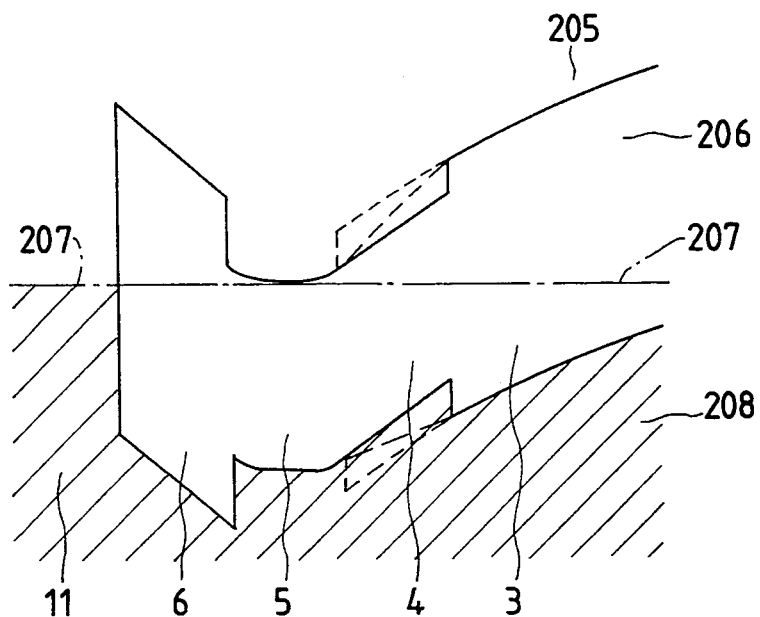
FIG. 4 is a band diagram of the field-effect transistor of Embodiment 1 of the present invention.

This embodiment is an application of the present invention to a field-effect transistor. FIG. 1 is a sectional view of the field-effect transistor of the first embodiment of the present invention. The production method for the field-effect transistor will be explained hereunder.

By the MBE method, an undoped GaAs layer 300 nm) 2, a p-type GaAs layer (Be impurity concentration $3 \times 10^{16}/cm^3$, thickness 300 nm) 3, a p-type InGaAs layer (InAs mole fraction 0.2, Be impurity concentration $3 \times 10^{16}/cm^3$, thickness 15 nm) 4, an n-type InGaAs layer (InAs mole fraction 0.2, Si impurity concentration $1 \times 10^{19}/cm^3$, thickness 5 nm) 5, an undoped AlGaAs layer (AlAs mole fraction 0.3, thickness 10 nm) 6, and an undoped GaAs layer (thickness 35 nm) 7 are grown on a semi-insulating GaAs substrate 1 one by one. The substrate temperature during growth ranges from 480° C. to 540° C. in order to suppress the carrier compensation, In desorption, and impurity diffusion.

The lattice constant of the p-type InGaAs layer 4 and the n-type InGaAs layer 5 is different from that of GaAs thereunder. Therefore, when the layers are too thick (more than the critical thickness), dislocations are generated in the layers. Therefore, it is necessary to set the total thickness of the layers to the critical thickness or less. In this embodiment, the total thickness of the layers is set at 20 nm so as to prevent dislocations.

Next, the semiconductor layer at the contact part is etched 50 nm to 150 nm from the surface thereof by the ECR plasma etching method using $SiCl_4$ gas and then an n-type GaAs layer (Si impurity concentration $1 \times 10^{19}/cm^3$, thickness 700 nm) 8 is selectively grown at the contact part by the MOCVD method. The substrate temperature during selective growth is 540° C. in order to suppress the diffusion of impurities in the InGaAs channel layer.

Next, a source electrode 9 and a drain electrode 10 of an AuGe-Ni-Au laminated layer are formed on the n-type GaAs layer 8 by the lift-off method and alloyed at 400° C. The undoped GaAs layer 7 at the gate electrode forming part is removed by etching by the reactive ion etching method using $CCl_2F_2$ gas and then a gate electrode 11 of a Ti-Pt-Au laminated layer is formed by the lift-off method.

In the field-effect transistor manufactured by the above process, by the effect that the p-type InGaAs layer 4 which functions as a carrier conduction auxiliary layer is inserted on the substrate side of the n-type InGaAs channel layer 5, the contact resistance between the n-type InGaAs layer 5 and the n-type GaAs layer 8 can be reduced to 10 ohm per a width of 10 $\mu$m. As a result, satisfactory transistor characteristics such that the K value is large (e.g.,—14 mA/V² per a width of 10 $\mu$m—) because the source resistance is low (e.g.,—25 ohm per a width of 10 $\mu$m—) and the transconductance is high can be realized.

In this embodiment, the carrier conduction auxiliary layer is formed on the substrate side of the channel layer. However, it is of course apparent that the carrier conduction auxiliary layer may be formed on the opposite side of the substrate without the effect of the present invention being affected. However, the distance between the gate and the channel layer becomes long and the practicability as a field-effect transistor is reduced.

EMBODIMENT 2

Figure 5:
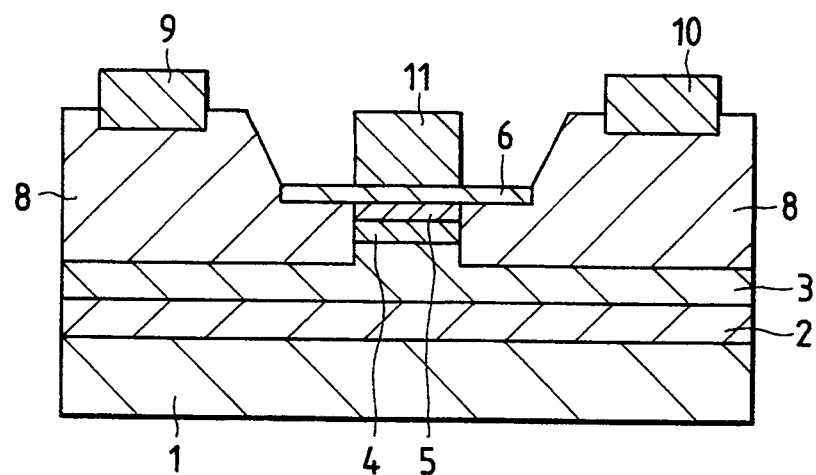
FIG. 5 is a sectional view of the field-effect transistor of Embodiment 2 of the present invention.

The second embodiment of the present invention will be explained with reference to the sectional view shown in FIG. 5. This embodiment is also an application example to a field-effect transistor. The production method for the field-effect transistor will be explained hereunder. By the MBE method, an undoped GaAs layer (thickness 300 nm) 2, a p-type GaAs layer (Be impurity concentration $3 \times 10^{16}/cm^3$, thickness 300 nm) 3, a p-type InGaAs layer (InAs mole fraction 0.2, Be impurity concentration $3 \times 10^{16}/cm^3$, thickness 15 nm) 4, an n-type InGaAs layer (InAs mole fraction 0.2, Si impurity concentration $1 \times 10^{19}/cm^3$, thickness 5 nm) 5, and an undoped AlGaAs layer (AlAs mole fraction 0.3, thickness 10 nm) 6 are grown on a semi-insulating GaAs substrate 1 one by one. The substrate temperature during growth ranges from 480° C. to 540° C. and the carrier compensation, In desorption, and impurity diffusion are suppressed.

Next, a gate electrode 11 of a WSi-W laminated layer is formed on the undoped AlGaAs layer 6 by several steps including the dry etching method using NF$_3$ gas.

The semiconductor layer at the contact part is etched 15 nm to 50 nm from the surface thereof by the ECR plasma etching method using SiCl$_4$ gas. Then, the p-type GaAs layer 3, p-type InGaAs layer 4, and n-type InGaAs layer 5 are selectively etched isotropically with 100 nm for the undoped AlGaAs layer 6 by the photochemical dry etching method using CH$_3$Br gas so as to undercut the undoped AlGaAs layer 6. Then an n-type GaAs layer (Si impurity concentration $1 \times 10^{19}/cm^3$, thickness 700 nm) 8 is selectively grown at the contact part by the MOCVD method. The substrate temperature during selective growth is 540° C. and the diffusion of impurities in the InGaAs channel layer 5 is suppressed.

A source electrode 9 and a drain electrode 10 of an AuGe-Ni-Au laminated layer are formed on the n-type GaAs layer 8 by the lift-off method and alloyed at 400° C.

In the field-effect transistor manufactured by the above process, by the effect that the p-type InGaAs layer 4 is inserted on the substrate side of the n-type InGaAs channel layer 5, the contact resistance between the n-type InGaAs layer 5 and the n-type GaAs layer 8 can be reduced to 10 ohm per a width of 10 μm. Furthermore, since the n-type GaAs layer 8 is moved near the gate electrode 11 by undercutting in this embodiment, the parasitic resistance under the undoped AlGaAs layer 6 can be reduced to 2 ohm. As a result, the source resistance can be reduced to 17 ohm per a width of 10 μm.

EMBODIMENT 3

Figure 6:
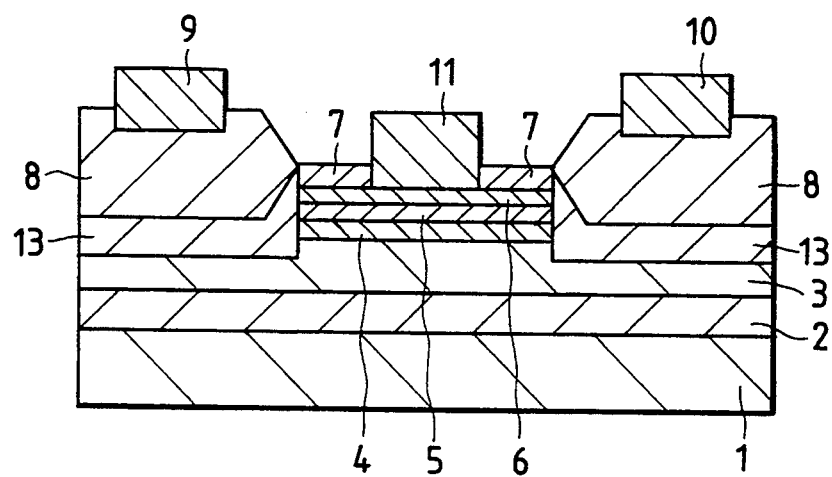
FIG. 6 is a sectional view of the field-effect transistor of Embodiment 3 of the present invention.

The third embodiment of the present invention will be explained with reference to the sectional view shown in FIG. 6. This embodiment is also an application example to a field-effect transistor.

In this embodiment, a laminating structure of an n-type InGaAs layer (InAs mole fraction 0.2, Si impurity concentration $1 \times 10^{19}/cm^3$, thickness 20 nm) 13 and a n-type GaAs layer (Si impurity concentration $1 \times 10^{19}/cm^3$, thickness 680 nm) 8 is used as a contact layer instead of the n-type GaAs layer 8 of the first embodiment. The other parts of the structure and the production method are the same as those of the first embodiment.

In the first embodiment, the contact part with a small contact area between the n-type InGaAs layer 5 and the n-type GaAs layer 8 is a heterojunction and the contact resistance is adversely affected by notches generated in the band structure of the junction part. In the third embodiment illustrated in FIG. 6, the contact part with a small contact area between the n-type InGaAs layer 5 and the n-type InGaAs layer 13 is a homojunction and the contact part between the n-type InGaAs layer 13 and the n-type GaAs layer 8 which is a heterojunction has a large contact area. Therefore, an increase in the contact resistance due to notches of the band structure can be ignored.

In the third embodiment, by the effect that the p-type InGaAs layer 4 is inserted on the substrate side of the n-type InGaAs channel layer 5 and the effect that the n-type InGaAs layer 13 is inserted on the substrate side of the n-type GaAs layer 8, the contact resistance between the n-type InGaAs layer 5 and the n-type GaAs layer 8 can be reduced to 6 ohm per a width of 10 μm. As a result, satisfactory transistor characteristics such that the source resistance is 21 ohm per a width of 10 μm and the K value is 15 mA/V$^2$ per a width of 10 μm can be realized.

EMBODIMENT 4

Figure 7:
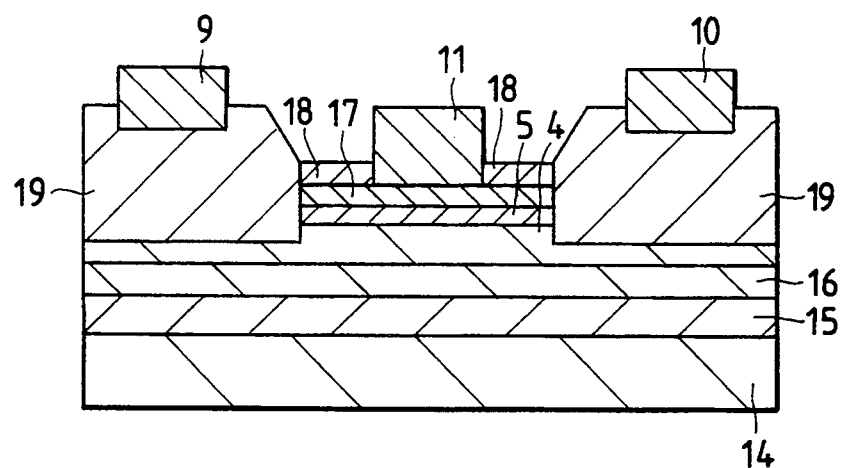
FIG. 7 is a sectional view of the field-effect transistor of Embodiment 4 of the present invention.

The fourth embodiment of the present invention will be explained with reference to the sectional view shown in FIG. 7. This embodiment is also an application example to a field-effect transistor. The production process for the field-effect transistor of FIG. 7 will be explained hereunder.

By the MBE method, an undoped InAlAs layer (InAs mole fraction 0.53, thickness 300 nm) 15, a p-type InAlAs layer (InAs mole fraction 0.53, Be impurity concentration $3 \times 10^{16}/cm^3$, thickness 300 nm) 16, a p-type InGaAs layer (InAs mole fraction 0.53, Be impurity concentration $3 \times 10^{16}/cm^3$, thickness 50 nm) 4, an n-type InGaAs layer (InAs mole fraction 0.53, Si impurity concentration $1 \times 10^{19}/cm^3$, thickness 5 nm) 5, an undoped InAlAs layer (InAs mole fraction 0.53, thickness 10 nm) 17, and an undoped InGaAs layer (InAs mole fraction 0.53, thickness 35 nm) 18 are grown on a semi-insulating InP substrate 14 one by one. The substrate temperature during growth ranges from 480° C. to 540° C. in order to suppress the carrier compensation, In desorption, and impurity diffusion.

Next, the semiconductor layer at the contact part is etched 50 nm to 150 nm from the surface thereof by the ECR plasma etching method using SiCl$_4$ gas and then an n-type InGaAs layer (InAs mole fraction 0.53, Si impurity concentration $1 \times 10^{19}/cm^3$, thickness 700 nm) 19 is selectively grown at the contact part by the MOCVD method. The substrate temperature during selective growth is 540° C. in order to suppress the diffusion of impurities in the InGaAs channel layer 5. A source electrode 9 and a drain electrode 10 of an AuGe-Ni-Au laminated layer are formed on the n-type InGaAs layer 19 by the lift-off method and alloyed at 400° C.

The undoped InGaAs layer 18 at the gate electrode forming part is removed by etching by the photochemical dry etching method using CH$_3$Br gas and then a gate electrode 11 of a Ti-Pt-Au laminated layer is formed by the lift-off method.

In the field-effect transistor manufactured by the above process, by the effect that the p-type InGaAs layer 4 is inserted on the substrate side of the n-type InGaAs channel layer 5, the contact resistance between the n-type InGaAs layer 5 and the n-type InGaAs layer 19 can be reduced to 6 ohm per a width of 10 μm. As a result, the source resistance can be reduced to 21 ohm per a width of 10 μm.

EMBODIMENT 5

Figure 8:
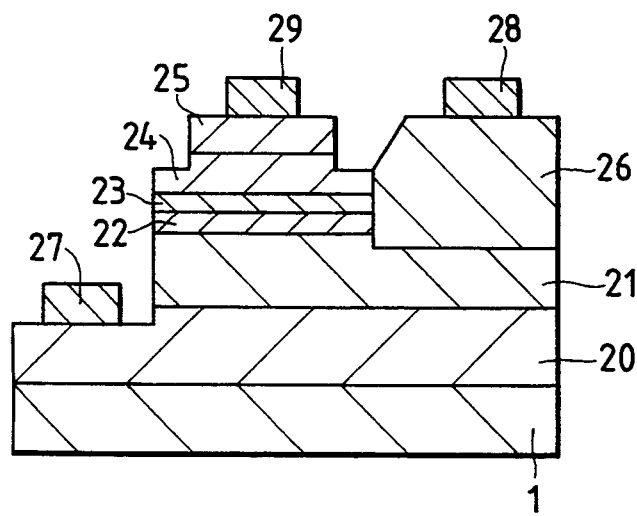
FIG. 8 is a sectional view of the bipolar transistor of Embodiment 5 of the present invention

The fifth embodiment of the present invention will be explained with reference to the sectional view shown in FIG. 8. This embodiment is an example of an embodiment of the present invention applied to a bipolar transistor. The production process for the bipolar transistor will be explained hereunder.

By the MBE method, an n-type GaAs layer (thickness 600 nm, Si impurity concentration $5\times10^{18}/cm^3$) 20, an undoped GaAs layer (thickness 400 nm) 21, an undoped InGaAs layer (InAs mole fraction 0.2, thickness 15 nm) 22, a p-type InGaAs layer (InAs mole fraction 0.2, Be impurity concentration $6\times10^{19}/cm^3$, thickness 5 nm) 23, an n-type AlGaAs layer (AlAs mole fraction 0.3, Si impurity concentration $1\times10^{18}/cm^3$, thickness 100 nm) 24, and an n-type GaAs layer (Si impurity concentration $5\times10^{18}/cm^3$, thickness 200 nm) 25 are grown on a semi-insulating GaAs substrate 1 one by one. The substrate temperature during growth ranges from 480° C. to 540° C. in order to suppress the In desorption and impurity diffusion.

The semiconductor layer except the emitter part is etched 250 nm from the surface thereof by the wet etching method. Next, the semiconductor layer at the base contact part is etched 100 nm by the ECR plasma etching method using $SiCl_4$ gas and then a p-type GaAs layer (Zn impurity concentration $1\times10^{20}/cm^3$, thickness 250 nm) 26 is selectively grown at the base contact part by the MOCVD method. The substrate temperature during selective growth is 540° C. and the diffusion of impurities in the InGaAs base layer 23 is suppressed. Next, the semiconductor layer at the collector electrode forming part is etched 800 nm by the wet etching method.

A collector electrode 27 and an emitter electrode 29 of an AuGe-Ni-Au laminated layer are formed by the lift-off method and alloyed at 400° C. A base electrode 28 of an AuZn-Au laminated layer is formed by the lift-off method in the same way and alloyed at 400° C.

In the bipolar transistor manufactured by the above process, by the effect that the undoped InGaAs layer 22 is inserted on the substrate side of the p-type InGaAs layer 23, the contact resistance between the p-type InGaAs layer 23 and the p-type GaAs layer 26 can be reduced to a sufficiently low value. Therefore, an InGaAs layer with a high electron drift velocity is used as a base layer and the thickness of the base layer can be reduced to 5 nm as shown in this embodiment. By doing this, the base transit time is shortened and the cutoff frequency is improved to 60 GHz.

EMBODIMENT 6

Figure 9:
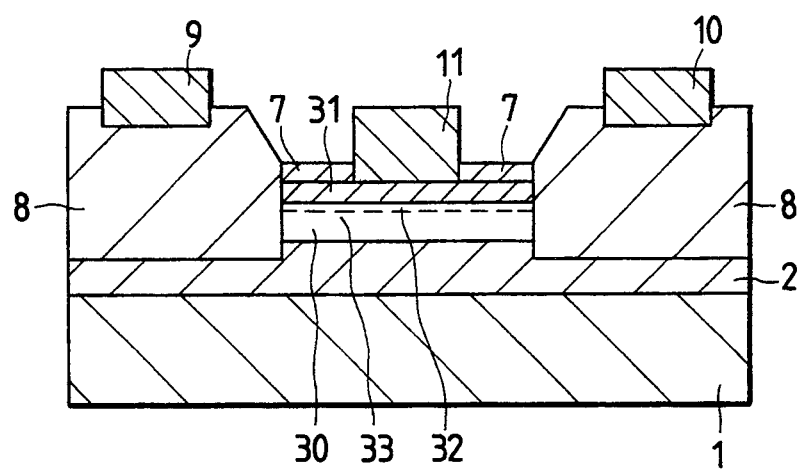
FIG. 9 is a sectional view of the field-effect transistor of Embodiment 6 of the present invention.

The sixth embodiment of the present invention will be explained with reference to the sectional view shown in FIG. 9. This embodiment is an example of an embodiment of the present invention applied to a high electron mobility transistor (HEMT). The production process for the high electron mobility transistor will be explained hereunder. By the MBE method, an undoped GaAs layer (thickness 600 nm) 2, an undoped InGaAs layer (InAs mole fraction 0.2, thickness 20 nm) 30, an n-type AlGaAs layer (AlAs mole fraction 0.2, Si impurity concentration $1\times10^{18}/cm^3$, thickness 25 nm) 31, and an undoped GaAs layer (thickness 35 nm) 7 are grown on a semi-insulating GaAs substrate 1 one by one. The substrate temperature during growth ranges from 480° C. to 540° C. in order to suppress the carrier compensation, In desorption, and impurity diffusion.

Next, the semiconductor layer at the contact part is etched 60 nm to 160 nm from the surface thereof by the ECR plasma etching method using $SiCl_4$ gas and then an n-type GaAs layer (Si impurity concentration $1\times10^{19}/cm^3$, thickness 700 nm) 8 is selectively grown at the contact part by the MOCVD method.

Next, a source electrode 9 and a drain electrode 10 of an AuGe-Ni-Au laminated layer are formed on the n-type GaAs layer 8 by the lift-off method and alloyed at 400° C. The undoped GaAs layer 7 at the gate electrode forming part is removed by etching by the reactive ion etching method using $CCl_2F_2$ gas and then a gate electrode 11 of a Ti-Pt-Au laminated layer is formed by the lift-off method.

In the field-effect transistor manufactured by the above process, among the undoped InGaAs layer 30, the part near the interface with the n-type AlGaAs layer 31 wherein two-dimensional electron gas is generated functions as a channel layer 32 and the other part functions as a carrier bypass path forming layer 33. Therefore, when the undoped InGaAs layer 30 is made sufficiently thick so as to reserve the carrier bypass path, the contact resistance between the channel layer 32 and the n-type GaAs layer 8 can be reduced practically.

In this embodiment, by making the undoped InGaAs layers 30 and 31 thick such as to 20 nm which is almost equal to the critical thickness, the contact resistance between the channel layer 31 and the n-type GaAs layer 8 can be reduced to 10 ohm per a width of 10 μm. As a result, satisfactory transistor characteristics that the value of transconductance factor K is such as 10 $mA/V^2$ per a width of 10 μm because the source resistance is low such as 25 ohm per a width of 10 μm and the transconductance is high can be realized.

EMBODIMENT 7

Figure 10:
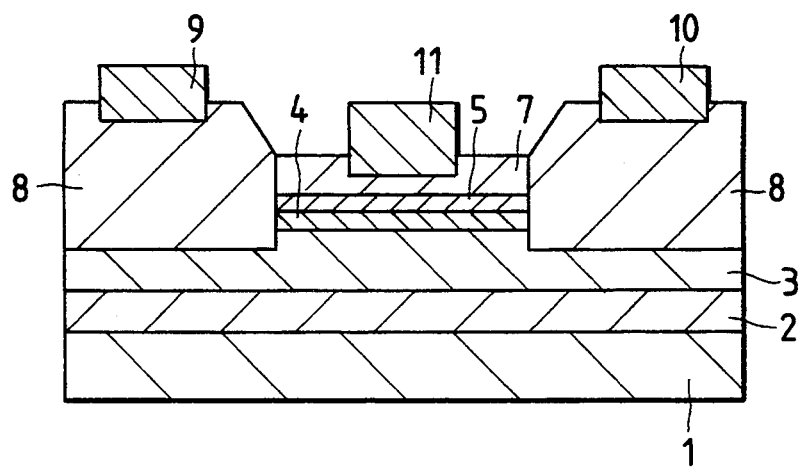
FIG. 10 is a sectional view of the field-effect transistor of Embodiment 7 of the present invention.

The seventh embodiment of the present invention will be explained with reference to the sectional view shown in FIG. 10. This embodiment is an example of an embodiment of the present invention applied to a field-effect transistor wherein the undoped AlGaAs layer 6 on the channel 5 in Embodiment 1 is not formed. The production method for the field-effect transistor will be explained hereunder. By the MBE method, an undoped GaAs layer (thickness 300 nm) 2, a p-type GaAs layer (Be impurity concentration $3\times10^{16}/cm^3$, thickness 300 nm) 3, a p-type InGaAs layer (InAs mole fraction 0.2, Be impurity concentration $3\times10^{16}/cm^3$, thickness 15 nm) 4, an n-type InGaAs layer (InAs mole fraction 0.2, Si impurity concentration $1\times10^{19}/cm^3$, thickness 5 nm) 5, and an undoped GaAs layer (thickness 45 nm) 7 are grown on a semi-insulating GaAs substrate 1 one by one. The substrate temperature during growth ranges from 480° C. to 540° C. and the carrier compensation, In desorption, and impurity diffusion are suppressed.

Next, the semiconductor layer at the contact part is etched 50 nm to 150 nm from the surface thereof by the ECR plasma etching method using SiCl$_4$ gas and then an n-type GaAs layer (Si impurity concentration $1 \times 10^{19}$/cm$^3$, thickness 700 nm) 8 is selectively grown at the contact part by the MOCVD method. The substrate temperature during selective growth is 540° C. and the diffusion of impurities in the InGaAs channel layer is suppressed.

Next, a source electrode 9 and a drain electrode 10 of an AuGe-Ni-Au laminated layer are formed on the n-type GaAs layer 8 by the lift-off method and alloyed at 400° C. The undoped GaAs layer 7 at the gate electrode forming part is removed 5 nm by etching with a solution of H$_3$PO$_4$ and H$_2$O$_2$ and then a gate electrode 11 of a Ti-Pt-Au laminated layer is formed by the lift-off method.

In this embodiment, the field-effect transistor does not have an AlGaAs layer wherein many interface states are formed, so that the effect of obstruction of carrier conduction is small compared with other embodiments having this layer. However, by forming a carrier bypass path forming layer, the sectional area of the carrier conduction path increases and hence the contact resistance between the n-type InGaAs layer 5 and the n-type GaAs layer 8 can be reduced. In this embodiment, the contact resistance can be reduced to 10 ohm per a width of 10 $\mu$m. As a result, satisfactory transistor characteristics such that the value of transconductance factor K is large such as 14 mA/V$^2$ per a width of 10 $\mu$m because the source resistance is low such as 25 ohm per a width of 10 $\mu$m and the transconductance is high can be realized.

According to the present invention, by inserting a graded layer wherein the mole fraction is changed on the substrate side of the channel layer or the base layer, a contact part with a low contact resistance between the channel layer or the base layer and the contact layer can be realized. As a result, a heterojunction field-effect transistor with a low source resistance or a heterojunction bipolar transistor of a base layer with a low base resistance can be realized and the transistor performance can be improved.

What is claimed is:

1. A semiconductor device comprising:
   a first n-type semiconductor layer;
   a second undoped or acceptor impurity doped semiconductor layer formed in contact with one side of said first semiconductor layer;
   a third undoped or acceptor impurity doped semiconductor layer formed on a side of said second semiconductor layer opposite to said first semiconductor layer; and
   a fourth n-type semiconductor layer which is a separate body from said first semiconductor layer;
   wherein said first semiconductor layer and said second semiconductor layer are equal in electron affinity, said third semiconductor layer is smaller in electron affinity than said second semiconductor layer, said second semiconductor layer acts as a carrier bypass path forming layer, and said first or second semiconductor layer is in direct contact with said fourth semiconductor layer.

2. A semiconductor device according to claim 1, said semiconductor device further comprising a fifth undoped or acceptor impurity doped semiconductor layer formed on a side of said first semiconductor layer opposite to said second semiconductor layer.

3. A semiconductor device according to claim 2, wherein said fourth semiconductor layer is formed in contact with said first semiconductor layer and said second semiconductor layer.

4. A semiconductor device according to claim 3, wherein said first semiconductor layer comprises InGaAs, said second semiconductor layer comprises InGaAs, said third semiconductor layer comprises GaAs, said fifth semiconductor layer comprises AlGaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

5. A semiconductor device according to claim 4, wherein the critical thickness is approximately 20 nm.

6. A semiconductor device according to claim 3, wherein said first semiconductor layer comprises InGaAs, said second semiconductor layer comprises InGaAs, said third semiconductor layer comprises AlGaAs, said fifth semiconductor layer comprises GaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

7. A semiconductor device according to claim 6, wherein the critical thickness is approximately 20 nm.

8. A semiconductor device according to claim 3, said semiconductor device further comprising an InP substrate, wherein said first semiconductor layer comprises InGaAs, said second semiconductor layer comprises InGaAs, said third semiconductor layer comprises InAlAs, said fifth semiconductor layer comprises InAlAs, and a composition of each of said layers is selected to produce a lattice match with the InP substrate.

9. A semiconductor device according to claim 8, wherein said first semiconductor layer is a channel layer of a field-effect transistor and said fourth semiconductor layer is a source and a drain contact layer comprising InGaAs.

10. A semiconductor device according to claim 3, wherein at the contact part of said first semiconductor layer and said fourth semiconductor layer, a part of the surface of said fourth semiconductor layer is in a surface which is almost the same as one surface of said first semiconductor layer.

11. A semiconductor device according to claim 3, wherein said first semiconductor layer is a base layer of a bipolar transistor and said fourth semiconductor layer is a base contact layer.

12. A semiconductor device according to claim 1, wherein said fourth semiconductor layer is formed in contact with said first semiconductor layer and said second semiconductor layer.

13. A semiconductor device according to claim 12, wherein said first semiconductor layer comprises InGaAs, said second semiconductor layer comprises InGaAs, said third semiconductor layer comprises GaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

14. A semiconductor device according to claim 13, wherein the critical thickness is approximately 20 nm.

15. A semiconductor device according to claim 12, said semiconductor device further comprising an InP substrate, wherein said first semiconductor layer comprises InGaAs, said second semiconductor layer comprises InGaAs, said third semiconductor layer comprises InAlAs, and a composition of each of said layers is selected to produce a lattice match with the InP substrate.

16. A semiconductor device according to claim 12, wherein said first semiconductor layer is a channel layer of a field-effect transistor, and said fourth semiconductor layer is a source and a drain contact layer, the part of said fourth semiconductor layer which is in contact with said first and second semiconductor layers comprises InGaAs, and a GaAs layer is laminated on said InGaAs layer.

17. A semiconductor device comprising:
a first p-type semiconductor layer;
a second undoped or donor impurity doped semiconductor layer formed in contact with one side of said first semiconductor layer;
a third undoped or donor impurity doped semiconductor layer formed on a side of said second semiconductor layer opposite to said first semiconductor layer; and
a fourth p-type semiconductor layer which is a separate body from said first semiconductor layer;
wherein said first semiconductor layer and said second semiconductor layer are equal in a sum of electron affinity and band gap, said third semiconductor layer is smaller in the sum of electron affinity and band gap than said second semiconductor layer, said second semiconductor layer acts as a carrier bypass path forming layer, and said first or second semiconductor layer is in direct contact with said fourth semiconductor layer.

18. A semiconductor device according to claim 17, said semiconductor device further comprising a fifth undoped or donor impurity doped semiconductor layer formed on a side of said first semiconductor layer opposite to said second semiconductor layer.

19. A semiconductor device according to claim 18, wherein said fourth semiconductor layer is formed in contact with said first semiconductor layer and said second semiconductor layer.

20. A semiconductor device according to claim 19, wherein said first semiconductor layer comprises InGaAs, said second semiconductor layer comprises InGaAs, said third semiconductor layer comprises GaAs, said fifth semiconductor layer comprises AlGaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

21. A semiconductor device according to claim 20, wherein the critical thickness is approximately 20 nm.

22. A semiconductor device according to claim 19, wherein said first semiconductor layer comprises InGaAs, said second semiconductor layer comprises InGaAs said third semiconductor layer comprises AlGaAs, said fifth semiconductor layer comprises GaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

23. A semiconductor device according to claim 22, wherein the critical thickness is approximately 20 nm.

24. A semiconductor device according to claim 19, said Semiconductor device further comprising an InP substrate, wherein said first semiconductor layer comprises InGaAs, said second semiconductor layer comprises InGaAs, said third semiconductor layer comprises InAlAs, said fifth semiconductor layer comprises InAlAs, and a composition of each of said layers is selected to produce a lattice match with the InP substrate.

25. A semiconductor device according to claim 24, wherein said first semiconductor layer is a channel layer of a field-effect transistor and said fourth semiconductor layer is a source and a drain contact layer comprising InGaAs.

26. A semiconductor device according to claim 19, wherein at the contact part of said first semiconductor layer and said fourth semiconductor layer, a part of the surface of said fourth semiconductor layer is in a surface which is almost the same as one surface of said first semiconductor layer.

27. A semiconductor device according to claim 19, wherein said first semiconductor layer is a base layer of a bipolar transistor and said fourth semiconductor layer is a base contact layer.

28. A semiconductor device according to claim 17, wherein said fourth semiconductor layer is formed in contact with said first semiconductor layer and said second semiconductor layer.

29. A semiconductor device according to claim 28, wherein said first semiconductor layer comprises InGaAs, said second semiconductor layer comprises InGaAs, said third semiconductor layer comprises GaAs, said first and second semiconductor layers are formed on a semiconductor layer of which a lattice constant is different from a lattice constant of said first and second semiconductor layers, and a total thickness of said first and second semiconductor layers is not more than a critical thickness of InGaAs to prevent said first and second semiconductor layers from generating dislocations due to the difference in the lattice constants.

30. A semiconductor device according to claim 29, wherein the critical thickness is approximately 20 nm.

31. A semiconductor device according to claim 28, said semiconductor device further comprising an InP substrate, wherein said first semiconductor layer comprises InGaAs, said second semiconductor layer comprises InGaAs, said third semiconductor layer comprises InAlAs, and a composition of each of said layers is selected to produce a lattice match with the InP substrate.

32. A semiconductor device according to claim 28, wherein said first semiconductor layer is a channel layer of a field-effect transistor, and said fourth semiconductor layer is a source and a drain contact layer, the part of said fourth semiconductor layer which is in contact with said first and second semiconductor layers comprises InGaAs, and a GaAs layer is laminated on said InGaAs layer.

33. A semiconductor device comprising:
a first n-type InGaAs layer;
a second undoped or acceptor impurity doped InGaAs layer formed in contact with one side of said first InGaAs layer;
an undoped or acceptor impurity doped GaAs layer formed on a side of said second InGaAs layer opposite to said first InGaAs layer; and
an n-type semiconductor layer which is a separate body from said first InGaAs layer;
wherein said second InGaAs layer acts as a carrier bypass path forming layer, and said separate n-type semiconductor layer is formed in contact with said first second InGaAs layers.

34. A semiconductor device comprising:
a first p-type InGaAs layer;
a second undoped or donor impurity doped InGaAs layer formed in contact with one side of said first InGaAs layer;
an undoped or donor impurity doped GaAs layer formed on aside of said second InGaAs layer opposite to said first InGaAs layer; and
and a p-type semiconductor layer which is separate body from said first InGaAs layer;
wherein said second InGaAs layer acts as a carrier bypass path forming layer, and said separated p-type semiconductor layer is formed in contact with said first and second InGaAs layers.

* * * * *

UNITED STATES PATENT AND TRADEMARK OFFICE
CERTIFICATE OF CORRECTION

PATENT NO. : 5,351,128
DATED : September 27, 1994
INVENTOR(S) : Shigeo GOTO et al.

It is certified that error appears in the above-indentified patent and that said Letters Patent is hereby corrected as shown below:

| Column | Line | |
|---|---|---|
| 1 | 56 | Delete "object of the"; change "provide" to --provides--. |
| 2 | 66 | After "transistor" insert --,--. |
| 3 | 29 | Delete "that". |
| 3 | 33 | After "invention" insert --,--. |
| 3 | 45 | Change "fleeing-effect" to --field-effect-- |
| 4 | 6 | Change "following the" to --the following-- |
| 4 | 21 | Change "1 X $10^{19}$" to --1 X $10^{19}$--. |
| 8 | 43 | After "characteristics" insert --such--. |
| 8 | 44 | After "is" insert --large--. |
| 8 | 63 | Change "1 X $10^{19}$" to --1 X $10^{19}$--. |

UNITED STATES PATENT AND TRADEMARK OFFICE
CERTIFICATE OF CORRECTION

PATENT NO. : 5,351,128
DATED : September 27, 1994
INVENTOR(S) : Shigeo GOTO et al.

It is certified that error appears in the above-indentified patent and that said Letters Patent is hereby corrected as shown below:

| Column | Line | |
|---|---|---|
| 12 | 17 | Change "Semiconductor" to --semiconductor-- |
| 14 | 2 | After "first" insert --and--. |
| 14 | 9 | Change "aside" to --a side--. |
| 14 | 11 | Delete "and"; after "is" insert --a--. |

Signed and Sealed this

Twenty-eight Day of February, 1995

Attest:

BRUCE LEHMAN

Attesting Officer    Commissioner of Patents and Trademarks